US012590818B2

(12) United States Patent
Stenberg et al.

(10) Patent No.: US 12,590,818 B2
(45) Date of Patent: Mar. 31, 2026

(54) CONTINUOUS WAVEFORM STREAMING

(71) Applicant: Landis+Gyr Innovations, Inc., Alpharetta, GA (US)

(72) Inventors: David Stenberg, West Lafayette (IN); David A. Bobick, West Lafayette, IN (US)

(73) Assignee: Landis+Gyr Technology, Inc., Alpharetta, GA (US)

(*) Notice: Subject to any disclaimer, the term of this patent is extended or adjusted under 35 U.S.C. 154(b) by 669 days.

(21) Appl. No.: 17/720,023

(22) Filed: Apr. 13, 2022

(65) Prior Publication Data

US 2023/0332927 A1 Oct. 19, 2023

(51) Int. Cl.
| | |
|---|---|
| *G01D 4/02* | (2006.01) |
| *G01R 22/06* | (2006.01) |
| *G01R 22/10* | (2006.01) |
| *G06Q 50/06* | (2024.01) |

(52) U.S. Cl.
CPC ............. *G01D 4/02* (2013.01); *G01R 22/061* (2013.01); *G01R 22/10* (2013.01); *G06Q 50/06* (2013.01)

(58) Field of Classification Search
CPC ........ G01D 4/02; G01R 22/061; G01R 22/10; G01R 22/063; G06Q 50/06
See application file for complete search history.

(56) References Cited

U.S. PATENT DOCUMENTS

| | | | | |
|---|---|---|---|---|
| 8,700,347 | B2 * | 4/2014 | Spanier | G01R 22/10 |
| | | | | 702/69 |
| 9,557,356 | B2 * | 1/2017 | Martin | G01D 4/002 |
| 10,060,957 | B2 * | 8/2018 | Curt | G01D 9/005 |
| 10,591,519 | B2 * | 3/2020 | Qiao | F03D 17/00 |

(Continued)

FOREIGN PATENT DOCUMENTS

CN 107782963 A * 3/2018

OTHER PUBLICATIONS

Faye, G. D. "Topic: Integration of smart meters in electrical grid: Application to the transmission and distribution grid of SENELEC ( Senegal National Electricity Agency)." PhD diss., Université Gaston Berger De Saint-Louis, 2020 (Year: 2020).*

(Continued)

*Primary Examiner* — Douglas Kay

(74) *Attorney, Agent, or Firm* — Kilpatrick Townsend & Stockton LLP

(57) ABSTRACT

A method for operating an electricity metering system is provided. The metering system includes an electronic energy meter and a metering application host. The method includes: receiving, by the electronic energy meter, an analog signal associated with power delivered using alternating current (AC); converting, by the electronic energy meter, the analog signal to a digital signal; generating, by the electronic energy meter, processed data and a continuous stream of waveform data; receiving, by a continuous waveform data stream module of the metering application host, the continuous stream of waveform data; requesting, by a first metering (Continued)

application hosted by the metering application host, at least a first portion of the continuous stream of waveform data; and transferring, by the continuous waveform data stream module, the at least a first portion of the continuous stream of waveform data to the first metering application.

16 Claims, 8 Drawing Sheets

(56) References Cited

U.S. PATENT DOCUMENTS

| | | | | | |
|---|---|---|---|---|---|
| 2010/0153036 | A1* | 6/2010 | Elwarry | ............... | G01R 21/133 |
| | | | | | 702/62 |
| 2015/0276825 | A1* | 10/2015 | Curt | .................. | G01R 19/2513 |
| | | | | | 702/58 |
| 2016/0033580 | A1* | 2/2016 | Qiao | .................... | G01R 31/343 |
| | | | | | 324/765.01 |
| 2019/0124424 | A1* | 4/2019 | Torpy | ....................... | H04Q 9/00 |
| 2022/0206047 | A1* | 6/2022 | Curt | ..................... | G01R 21/133 |

OTHER PUBLICATIONS

Burstinghaus, Edward J. "Resampled pulse width modulation methods for high-bandwidth power electronic amplifiers." PhD diss., Queensland University of Technology, 2020 (Year: 2020).*

Bank, Jason, and Benjamin Kroposki. "Development of a real-time, high-speed distribution level data acquisition system." In 2012 IEEE PES Innovative Smart Grid Technologies (ISGT), pp. 1-6. IEEE, 2012 (Year: 2012).*

PCT Patent Application No. PCT/US2023/018017, Invitation to Pay Additional Fees and, Where Applicable, Protest Fee, Jul. 18, 2023, 7 pages.

PCT Patent Application No. PCT/US2023/018017, International Search Report and Written Opinion, Sep. 12, 2023, 22 pages.

* cited by examiner

400

Receive, by the electronic energy meter, an analog signal associated with power delivered using alternating current (AC)

402

↓

Convert, by the electronic energy meter, the analog signal to a digital signal

404

↓

Generate, by the electronic energy meter, processed data and a continuous stream of waveform data

406

↓

Receive, by a continuous waveform data stream module of the metering application host, the continuous stream of waveform data

408

↓

Request, by a first metering application hosted by the metering application host, at least a first portion of the continuous stream of waveform data

410

↓

Transfer, by the continuous waveform data stream module, the at least a first portion of the continuous stream of waveform data to the first metering application

412

↓

Request, by a second metering application hosted by the metering application host, at least a second portion of the continuous stream of waveform data, wherein the first portion of the continuous stream of waveform data is different from the second portion of the continuous stream of waveform data

414

↓

Transfer, by the continuous waveform data stream module, the at least a second portion of the continuous stream of waveform data to the second metering application.

400'

Receive, by the electronic energy meter, an analog signal associated with power delivered using alternating current (AC)

452

Convert, by the electronic energy meter, the analog signal to a digital signal

454

Generate, by the electronic energy meter, processed data and a continuous stream of waveform data

456

Receive, by a continuous waveform data stream module of the metering application host, the continuous stream of waveform data

458

Request, by a first metering application hosted by the metering application host, at least a portion of the continuous stream of waveform data

460

Transfer, by the continuous waveform data stream module, the at least a portion of the continuous stream of waveform data to the first metering application

462

Receive, by the first metering application, at least a portion of the processed data in response to a triggering event

464

FIG. 4B

CONTINUOUS WAVEFORM STREAMING

TECHNICAL FIELD

This invention relates generally to power signal processing and more specifically to providing continuous waveform streaming data or processed data to metering applications.

BACKGROUND

Service providers utilize distributed networks to provide services to customers over large geographic areas. For example, power companies use power distribution lines to carry power from one or more generating stations (power plants) to residential and commercial customer sites. The generating stations use alternating current (AC) to transmit power over long distances via the power distribution lines. Long-distance transmission can be accomplished using a relatively high voltage. Substations located near the customer sites provide a step-down from the high voltage to a lower voltage (e.g., using transformers). Power distribution lines carry this lower-voltage AC from the substations to the endpoint devices customer sites.

Typically, electronic energy meters are installed at customer sites to monitor energy consumption by customers. Electronic energy meters track the amount of energy consumed by customers, typically measured in kilowatt-hours ("kWh"). The service provider uses the energy consumption information for billing and other purposes such as resource allocation forecasting.

More advanced metering applications may require a more detailed data set. Therefore, there is a need for improving the availability, flexibility, and usage of data collected by an electronic energy meter.

SUMMARY

Certain aspects and features include a system and method for providing continuous waveform streaming data or processed data to metering applications.

In accordance with one aspect of the disclosure, a method for operating an electricity metering system is provided. The electricity metering system includes an electronic energy meter and a metering application host. The method includes the following steps: receiving, by the electronic energy meter, an analog signal associated with power delivered using alternating current (AC); converting, by the electronic energy meter, the analog signal to a digital signal; generating, by the electronic energy meter, processed data and a continuous stream of waveform data; receiving, by a continuous waveform data stream module of the metering application host, the continuous stream of waveform data; requesting, by a first metering application hosted by the metering application host, at least a first portion of the continuous stream of waveform data; transferring, by the continuous waveform data stream module, the at least a first portion of the continuous stream of waveform data to the first metering application; requesting, by a second metering application hosted by the metering application host, at least a second portion of the continuous stream of waveform data, wherein the first portion of the continuous stream of waveform data is different from the second portion of the continuous stream of waveform data; and transferring, by the continuous waveform data stream module, the at least a second portion of the continuous stream of waveform data to the second metering application. In one implementation, the analog signal is an analog poly-phase signal, and the digital signal is a digital poly-phase signal. In another implementation, the analog signal is an analog single-phase signal, and the digital signal is a digital single-phase signal.

In accordance with another aspect of the disclosure, an electricity metering system is provided. The electricity metering system includes an electronic energy meter and a metering application host interfacing with the electronic energy meter. The electronic energy meter includes: an analog-to-digital converter (ADC) configured to convert an analog signal associated with power delivered using alternating current (AC) to a digital signal; and a power signal processing unit configured to generate processed data and a continuous stream of waveform data. The metering application host includes: a continuous waveform data stream module configured to receive the continuous stream of waveform data; and a first metering application configured to receive at least a first portion of the continuous stream of waveform data from the continuous waveform data stream module. In one implementation, the analog signal is an analog poly-phase signal, and the digital signal is a digital poly-phase signal. In another implementation, the analog signal is an analog single-phase signal, and the digital signal is a digital single-phase signal.

In accordance with one aspect of the disclosure, a method for operating an electricity metering system is provided. The electricity metering system includes an electronic energy meter and a metering application host. The method includes the following steps: receiving, by the electronic energy meter, an analog signal associated with power delivered using alternating current (AC); converting, by the electronic energy meter, the analog signal to a digital signal; generating, by the electronic energy meter, processed data and a continuous stream of waveform data; receiving, by a continuous waveform data stream module of the metering application host, the continuous stream of waveform data; requesting, by a first metering application hosted by the metering application host, at least a first portion of the continuous stream of waveform data; transferring, by the continuous waveform data stream module, the at least a portion of the continuous stream of waveform data to the first metering application; and receiving, by the first metering application, at least a portion of the processed data. In one implementation, the analog signal is an analog poly-phase signal, and the digital signal is a digital poly-phase signal. In another implementation, the analog signal is an analog single-phase signal, and the digital signal is a digital single-phase signal.

These illustrative examples are mentioned not to limit or define the disclosure, but to provide examples to aid understanding thereof. Additional examples and further description are provided in the Detailed Description.

BRIEF DESCRIPTION OF THE FIGURES

These and other features, aspects, and advantages of the present disclosure are better understood when the following Detailed Description is read with reference to the accompanying drawings, where:

FIG. 4A is a flowchart diagram illustrating a method for operating an electricity metering system comprising an electronic energy meter and a metering application host;

FIG. 4B is a flowchart diagram illustrating another method for operating an electricity metering system comprising an electronic energy meter and a metering application host.

DETAILED DESCRIPTION

Aspects of the present disclosure relate to providing continuous waveform streaming data and processed data to metering applications. Conventional electronic energy meters typically sample voltage and current values and aggregate these values over time to provide values for basic metering functions. For basic metering functions, the type of data required and the format may be predetermined. As the types of metering functions increase and the use of metering applications expands, there is a need for additional flexibility in the type and format of the data provided, as well as a need for continuous real-time data. For example, some metering applications may require a continuous stream of waveform data, some applications may require processed data, and some applications may require both. In addition, some applications may require time domain data, some applications may require frequency domain data, and some applications may require both.

In accordance with some aspects of the present disclosure, a metering application host may host one or more metering applications and may facilitate the transfer of the data needed by each of the metering applications. The data may be based on data obtained and processed by the meter and includes both continuous waveform data and processed data. Continuous waveform data includes waveform data based on current and voltage measurement data collected by the meter and processed by the meter. The waveform data is continuous since the meter is constantly generating the data. The meter does not require a trigger to initiate the collection or processing of the data. Continuous waveform data includes frequency domain data and time domain data. Processed data, also referred to herein as periodic data, includes sampled data associated with a time period.

Figure 1:
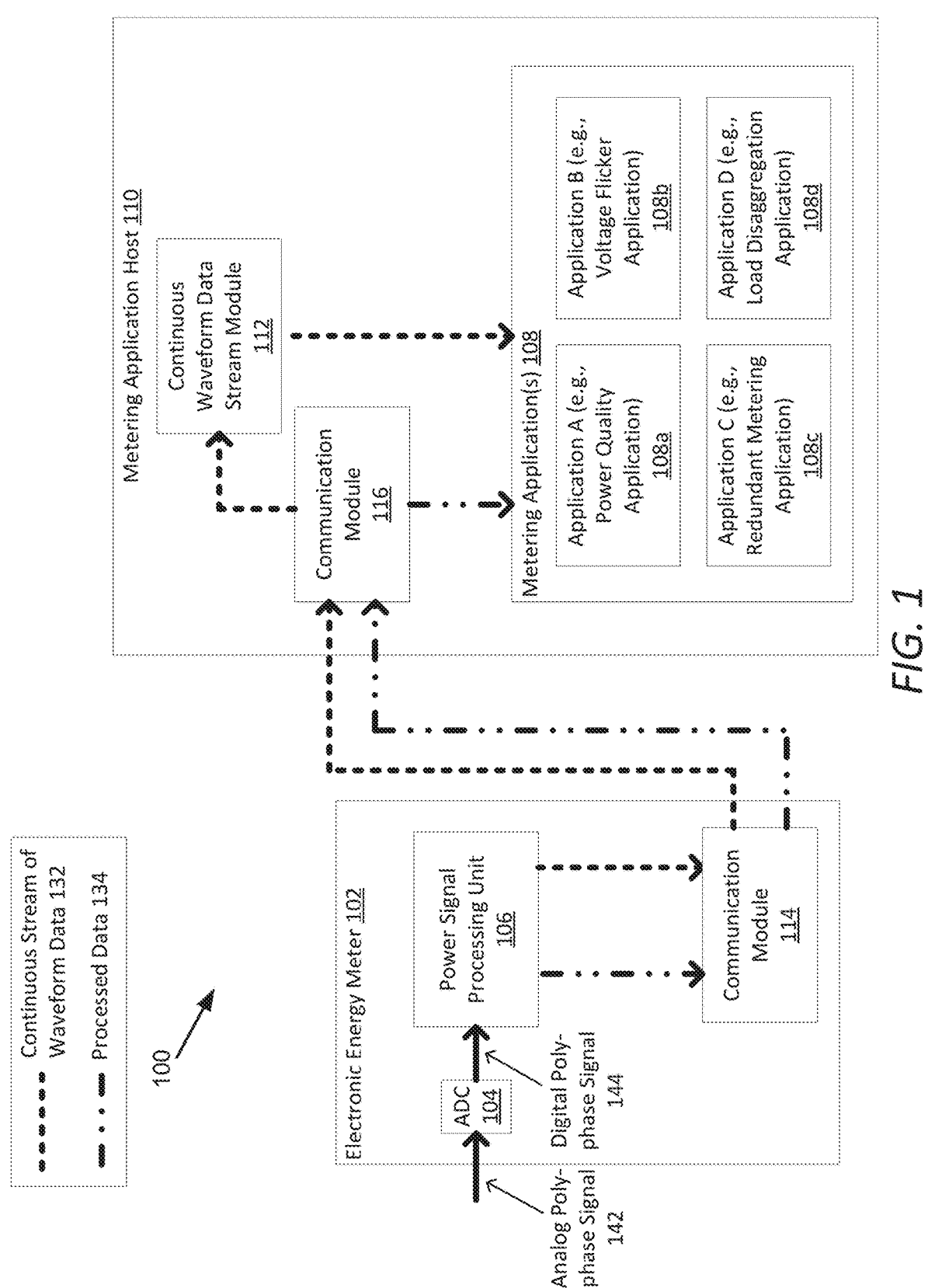
FIG. 1 is a diagram illustrating an example electricity metering system.

FIG. 1 is a diagram illustrating an example electricity metering system 100. The electricity metering system 100 includes an electronic energy meter 102 and a metering application host 110, among other things. The electronic energy meter 102 includes an analog-to-digital converter (ADC) 104, a power signal processing unit 106, and a communication module 114, among other things. The metering application host 110 includes a continuous waveform data stream module 112, a communication module 116, and one or more metering applications 108. In one implementation, the metering application host 110 is integrated in the electronic energy meter 102. In another implementation, the metering application host 110 is situated in a device separate from but in close proximity to the electronic energy meter 102, and both the electronic energy meter 102 and the device where the metering application host 110 is situated are located near the customer sites. It should be understood that these implementations are exemplary rather than limiting.

The electronic energy meter 102 is connected to power distribution lines which carry alternating current (AC) to the customer site (e.g., residential or commercial premises, etc.). The meter may be a single or poly-phase meter. When the meter is a poly-phase meter, an analog poly-phase signal 142 is received, either directly or indirectly, by the ADC 104. For a three-phase meter, the analog poly-phase signal has three voltage components (phase A line voltage, phase B line voltage, and phase C line voltage) and three current components (phase A line current, phase B line current, and phase C line current). Among the voltage components and the current components, one of the line voltages is used as a reference (sometimes referred to as a "reference channel"). Although an analog three-phase signal is used as an example throughout the disclosure, it is not intended to be limiting. The techniques described herein are also applicable to, for example, a single-phase meter. The ADC 104 converts the analog poly-phase signal 142 to a digital poly-phase signal 144.

The power signal processing unit 106 is connected, either directly or indirectly, to the ADC 104. In some implementations, a compensation and adjustment unit is coupled between the ADC 104 and the power signal processing unit 106. The compensation and adjustment unit is for calibration and temperature adjustment of the digital poly-phase signal 144 output by the ADC 104.

The power signal processing unit 106 is configured to process the digital poly-phase signal 144 received from the ADC 104. The power signal processing unit 106 can generate and output both a continuous stream of waveform data 132 and processed data 134. In one implementation, the power signal processing unit 106 is a microcontroller unit (MCU), which is fabricated on an integrated circuit (IC) chip and contains one or more CPUs along with memory and programmable input/output peripherals. In one example, the memory includes built-in flash Random-Access Memories (RAMs).

Figure 2:
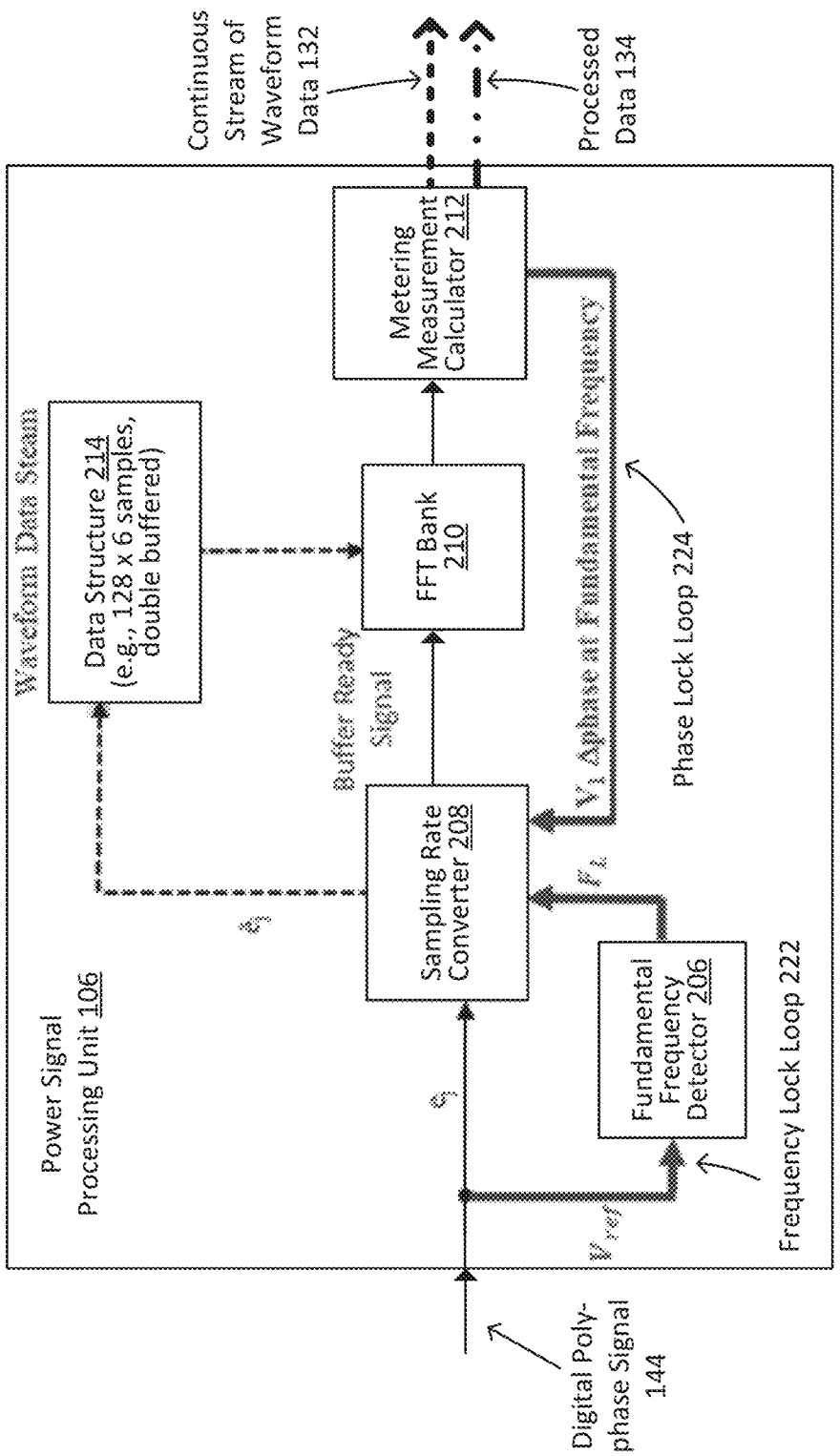
FIG. 2 is a diagram illustrating an example power signal processing unit 106 shown in FIG. 1.

FIG. 2 is a diagram illustrating an example power signal processing unit 106 shown in FIG. 1. In the example shown in FIG. 2, the power signal processing unit 106 includes, among other things, a fundamental frequency detector 206, a sampling rate converter 208, a Fast Fourier Transformation (FFT) bank 210, and a metering measurement calculator 212. It should be understood that these components are exemplary rather than limiting, and that the power signal processing unit 106 may also include other components in other implementations.

As mentioned above, the digital poly-phase signal 144, which is sampled at a first sampling rate (also referred to as the "ADC sampling rate") $F_{ADC}$, is fed to the fundamental frequency detector 206, which detects a fundamental frequency (i.e., the line frequency) $F_L$ of the analog poly-phase signal 142 based on the converted digital poly-phase signal 144. In one implementation, the fundamental frequency detector 206 includes a band-pass filter and a zero-crossing detector.

After the fundamental frequency $F_L$ is detected, the fundamental frequency $F_L$ is fed to the sampling rate converter 208, and a second sampling rate (also referred to as the "output sampling rate" or "resampling rate") $F_S$ is determined. The output sampling rate $F_S$ is based on and tracks the fundamental frequency $F_L$. When the fundamental frequency $F_L$ deviates from its nominal value, the output sampling rate $F_S$ adjusts proportionally. Thus, the output sampling rate $F_S$ is frequency-locked to the fundamental frequency $F_L$. In other words, the power signal processing unit 106 includes a frequency lock loop 222 as shown in FIG. 2. In one implementation, the output sampling rate $F_S$ is an integer multiple of the fundamental frequency $F_L$.

The sampling rate converter 208 also receives the digital poly-phase signal 144. The sampling rate converter 208 then resamples the digital poly-phase signal 144 at the output sampling rate $F_S$. Therefore, the digital poly-phase signal is converted from the ADC sampling rate $F_{ADC}$ to the output sampling rate $F_S$. The resampling ratio R is $F_S/F_{ADC}$. In one implementation, the resampling process carried out by the sampling rate converter 208 includes, among other operations, the interpolation (also referred to as "up-sampling") operation and the decimation (also referred to as "down-sampling") operation, as mentioned above. In one implementation, the resampling process carried out by the sampling rate converter 208 is by using a poly-phase resampler having a poly-phase filter bank.

The FFT bank 210 receives and transforms the resampled digital poly-phase signal (after being buffered) to a frequency-domain signal using FFT. In one implementation, the FFT is performed in six channels (i.e., three voltage channels corresponding to three voltage components and three current channels corresponding to three current components) simultaneously. In one implementation, the FFT includes an N-point Discrete Fourier Transform (DFT).

The metering measurement calculator 212 receives the frequency-domain signal and is capable of calculating voltage, current, and/or energy measurements such as DC voltage measurements, DC current measurements, fundamental RMS squared measurements, fundamental phase measurements, fundamental watt measurements, and the like. Among other things, a phase angle of the reference voltage component (e.g., the phase A line voltage) can be calculated. The resampled digital signal is then adjusted by compensating the calculated phase angle. In one implementation, the calculated phase angle is converted to a delta sample. After the adjustment using the calculated phase angle, the zero-crossing of the reference voltage component (e.g., the phase A line voltage) is phase-locked to a fixed location in the output sampling stream, while all other voltage components (e.g., the phase B line voltage and the phase C line voltage) and current components (e.g., the phase A line current, the phase B line current, and the phase C line current) are phase-adjusted along with the reference channel such that all channels are phase-locked together. As such, the power signal processing unit 106 has a phase lock loop 224 as shown in FIG. 2. In one implementation, the phase angle is calculated and used for adjusting the resampled digital poly-phase signal for each cycle of the resampled digital poly-phase signal.

Subsequently, the adjusted resampled digital poly-phase signal, after being phase-locked, is transformed to an updated frequency-domain signal by the FFT bank 210. Then, the metering measurement calculator 212 can calculate one or more measurements, which are the processed data 134, based on the updated frequency-domain signal. Again, it should be understood that the components and the operations thereof shown in FIG. 2 are exemplary rather than limiting.

Referring back to FIG. 1, the communication module 114 of the electronic energy meter 102 is configured to interface with the communication module 116 of the metering application host 110. The continuous stream of waveform data 132 and the processed data 134 are transferred from the electronic energy meter 102 to the metering application host 110 through the communication modules 114 and 116. Various instructions, commands, or requests can be communicated between the electronic energy meter 102 and the metering application host 110 through the communication modules 114 and 116. In one implementation, the communication modules 114 and 116 interface with each other according to Universal Serial Bus (USB) protocols. It should be understood that other communication protocols may be employed as needed.

In one implementation, the metering application host 110 includes, among other components, one or more microprocessors and Dynamic Random-Access Memories (DRAMs) such as DDR5 SDRAMs. DRAMs typically have a large storage capacity in gigabytes (GBs) or terabytes (TBs), thus enabling storing the continuous stream of waveform data 132. It should be understood that other implementations may be employed as well.

The continuous waveform data stream module 112 is configured to receive the continuous stream of waveform data 132 output by the power signal processing unit 106. The continuous waveform data stream module 112 serves as a hub or buffer to store the continuous stream of waveform data 132 for the one or more metering applications 108. Each of the one or more metering applications 108 can subscribe to different sets of the continuous stream of waveform data 132. In other words, the architecture between the continuous waveform data stream module 112 and each of the one or more metering applications 108 is a publish-subscribe pattern, and each of the one or more metering applications 108 (functioning as a subscriber) requests one or more sets of the continuous stream of waveform data 132 from the continuous waveform data stream module 112 (functioning as a publisher). In this way, the continuous stream of waveform data 132 is managed by the metering application host 110 in a centralized manner, and the individual metering application 108 does not have to separately obtain the continuous stream of waveform data 132 from the electronic energy meter 102.

On the other hand, intermediate measurements, either identical to or different from the processed data 134, can be derived from the continuous stream of waveform data 132 by each of the one or more metering applications 108. As such, the one or more metering applications 108 have the flexibility to utilize both the processed data 134 provided by the power signal processing unit 106 and intermediate measurements derived by themselves from the continuous stream of waveform data 132. For example, one metering application 108 may need some intermediate measurements not included in the processed data 134 provided by the power signal processing unit 106. With the continuous stream of waveform data 132 available, the metering application 108 can derive those intermediate measurements not included in the processed data 134.

The one or more metering applications 108 may run in various operating systems such as operating systems based on the Linux kernel. The one or more metering applications 108 may be one of, for example, Java-type applications and native Linux applications. It should be understood that these examples are not intended to be limiting.

In the example shown in FIG. 1, there are four metering applications 108, i.e., Application A 108a, Application B 108b, Application C 108c, and Application D 108d. In the example shown in FIG. 1, Application A 108a is a power quality application; Application B 108b is a voltage flicker application; Application C 108c is a redundant metering application; and Application D 108d is a load disaggregation application 108d.

Some of the metering applications 108 may request the entirety of the continuous stream of waveform data 132. Some of the metering applications 108 may request a set of the continuous stream of waveform data 132. Different metering applications 108 may request different portions of the continuous stream of waveform data 132. For example, a first metering application 108 may request a first portion of the continuous stream of waveform data 132, while a second metering application 108 may request a second portion of the same continuous stream of waveform data 132.

In one example, the power quality application 108a may monitor the Total Harmonic Distortion (THD) of the voltage as received from the processed data 134. When the THD exceeds a trigger threshold, the power quality application 108a subscribes to or requests a set or portion of the continuous stream of waveform data 132. The set or portion of the continuous stream of waveform data 132 is received and stored by the power quality application 108a until it unsubscribes or puts a stop on its request, which may occur when the THD goes below the trigger threshold. The portion of the continuous stream of waveform data 132 received by the power quality application 108a can then be analyzed for purposes of determining, for example, the duration and type of event that may have occurred during the period when the THD exceeds the trigger threshold.

In the same electricity metering system 100, the voltage flicker application 108b is configured to record flicker events. The voltage flicker application 108b may monitor the RMS value of the voltage. When the criteria associated with observable flicker to lights connected to the monitored voltage occurs, the voltage flicker application 108b subscribes to or requests waveform data for two cycles, i.e., a set or portion of the continuous stream of waveform data 132, and then unsubscribes or puts a stop on its request. The waveform data is then associated with a flicker event in a log in the electricity metering system 100, where a collection of these flicker events along with corresponding waveform data are stored. The collection of flicker events along with corresponding waveform data may be sent to, for example, a central processing system via, for example, the communication module 116 or 106.

In another example, in addition to the power quality application 108a and the voltage flicker application 108b described in the example above, another metering application 108 is configured to continuously subscribe to the continuous stream of waveform data 132 and store it in a circular buffer. The size of the circular buffer ensures that the most recent sixty line cycles of waveform data can be stored in it. The power quality application 108a and the voltage flicker application 108b described in the example above, instead of subscribing to the waveform data themselves, request data at a particular offset from the most recent sixty line cycles of waveform data stored in the circular buffer.

In addition, different metering applications 108 may request the same portion of the continuous stream of waveform data 132 in different domains. For example, a first metering application 108 may request a portion of the continuous stream of waveform data 132 in the time domain, while a second metering application 108 may request the same portion of the continuous stream of waveform data 132 in the frequency domain.

Different meting applications 108 may derive different types of intermediate measurements from the continuous stream of waveform data 132. For example, the load disaggregation application 108d, which is configured to shed some loads when the line frequency deviates from 60 Hz by more than a threshold (e.g., 2 Hz), derives the line frequency from the continuous stream of waveform data 132. The power quality application 108a derives voltage harmonics and current harmonics from the continuous stream of waveform data 132.

Different metering applications 108 may or may not use the processed data 134. When the processed data 134 provided by the power signal processing unit 106 does not include some intermediate measurements needed by a metering application 108, the metering application 108 derives those intermediate measurements from the continuous stream of waveform data 132. For example, a first metering application 108 may derive all intermediate measurements needed from the continuous stream of waveform data 132 and do not use any of the processed data 134 provided by the power signal processing unit 106, while a second metering application 108 may use a portion of the processed data 134 and derive some intermediate measurements from the continuous stream of waveform data 132.

A portion of the processed data 134 may be transferred to a metering application 108 in response to some triggering events. For example, when an anomaly in the continuous stream of waveform data 132, the triggering event in this example, is observed, a power quality application 108a may send a request for a time domain waveform capture to the electronic energy meter 102, and the power signal processing unit 106 then transfers the requested time domain waveform capture to the power quality application 108a.

In addition, a metering application 108 may request the power signal processing unit 106 to add new types of processed data to the existing processed data 134. For example, the existing processed data 134 may not include peak voltages, the metering application 108 may request the power signal processing unit 106 to add peak voltages to the existing processed data 134. In one implementation, the metering application 108 may send a customization request to the electronic energy meter 102 to customize the processed data 134.

In addition, the continuous stream of waveform data 132, either in its entirety or a set thereof, can be transferred to more than one metering applications 108 simultaneously.

Figures 3A, 3B:
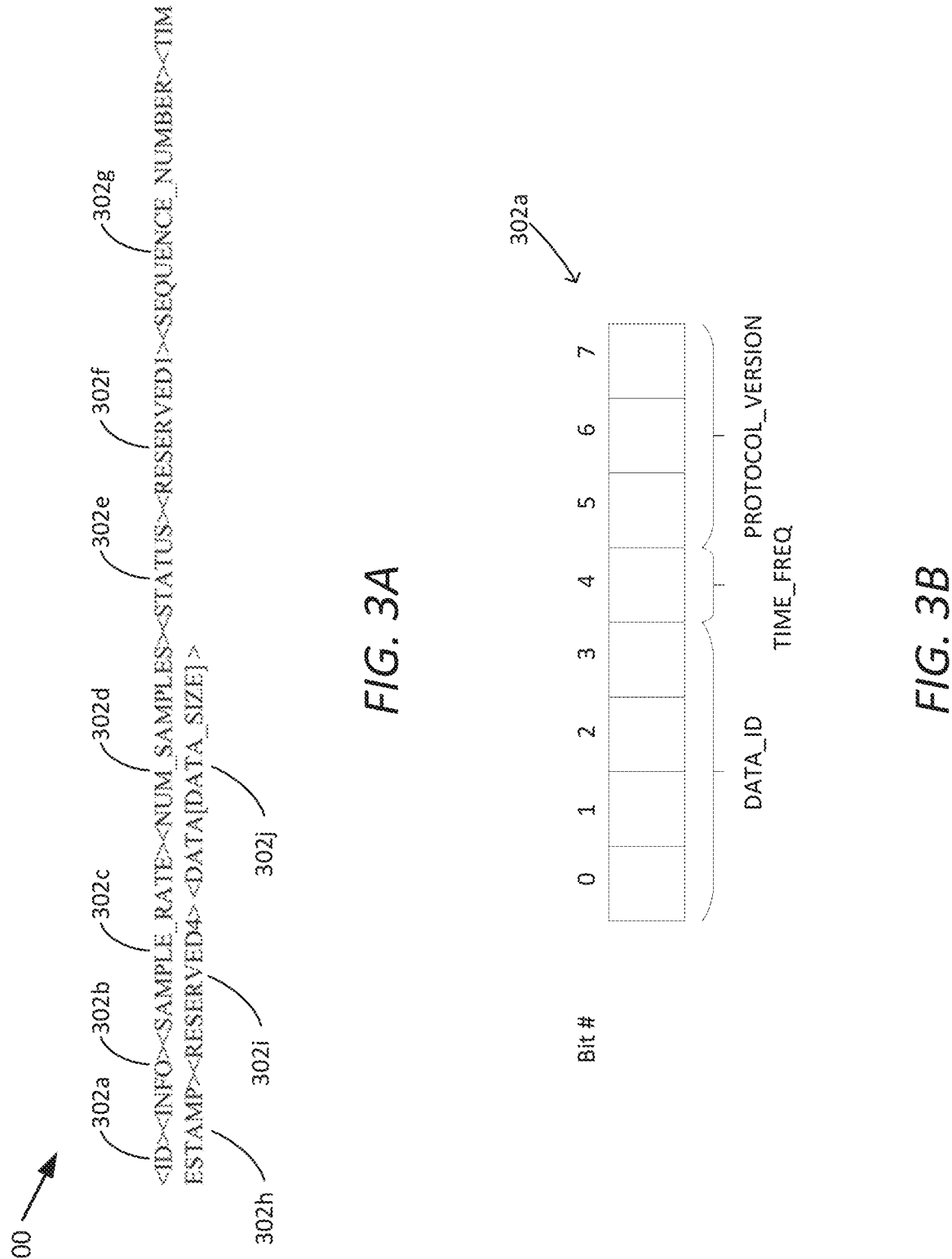
FIG. 3A is a diagram illustrating an example data structure.
FIG. 3B is a diagram illustrating an example field 302*a* shown in FIG. 3A.

FIG. 3A is a diagram illustrating an example data structure 300 for both continuous waveform data and processed data. It should be noted that the data structure 300 is generally applicable to and independent of the metering applications, although the data link and physical layers of applications may vary depending on usage and hardware. In the example shown in FIG. 3A, the data structure 300 includes multiple fields 302a to 302j (collectively "302"). Each field 302 has its own size (i.e., number of bits).

The field 302a is an ID field with a size of eight bits. FIG. 3B is a diagram illustrating an example field 302a. In the example shown in FIG. 3B, the ID field includes three subfields, namely the DATA_ID subfield with a size of four bits, the TIME_FREQ subfield with a size of one bit, and the PROTOCOL_VERSION subfield with a size of three bits. When the value of the DATA_ID subfield is 0, it indicates the data is continuous stream of waveform data 132. When the value of the DATA_ID subfield is 1, it indicates the data is processed data 134. The value of the DAT-ID subfield affects the definition of other fields and subfields. The values 2 to 15 of the DATA_ID subfield are reserved for the future.

The TIME_FREQ subfield corresponds to the domain of the output data. When the value of the TIME_FREQ subfield is 0, it indicates that the data output is in the time domain. When the value of the TIME_FREQ subfield is 1, it indicates that the data output is in the frequency domain. A value of 1 for the TIME_FREQ subfield is only valid when the DATA_ID subfield indicates continuous waveform data. Each sample in the frequency domain has two components, namely a magnitude component and a phase component. Two registers are used for each sample in the frequency domain, corresponding to the magnitude component and the phase component, respectively.

The PROTOCOL_VERSION subfield corresponds to up to eight versions of the protocol. When the value of the PROTOCOL_VERSION subfield is 0, it indicates that an initial version of the protocol is being used. The values 1 to 7 are reserved for future versions.

Figures 3C, 3D:
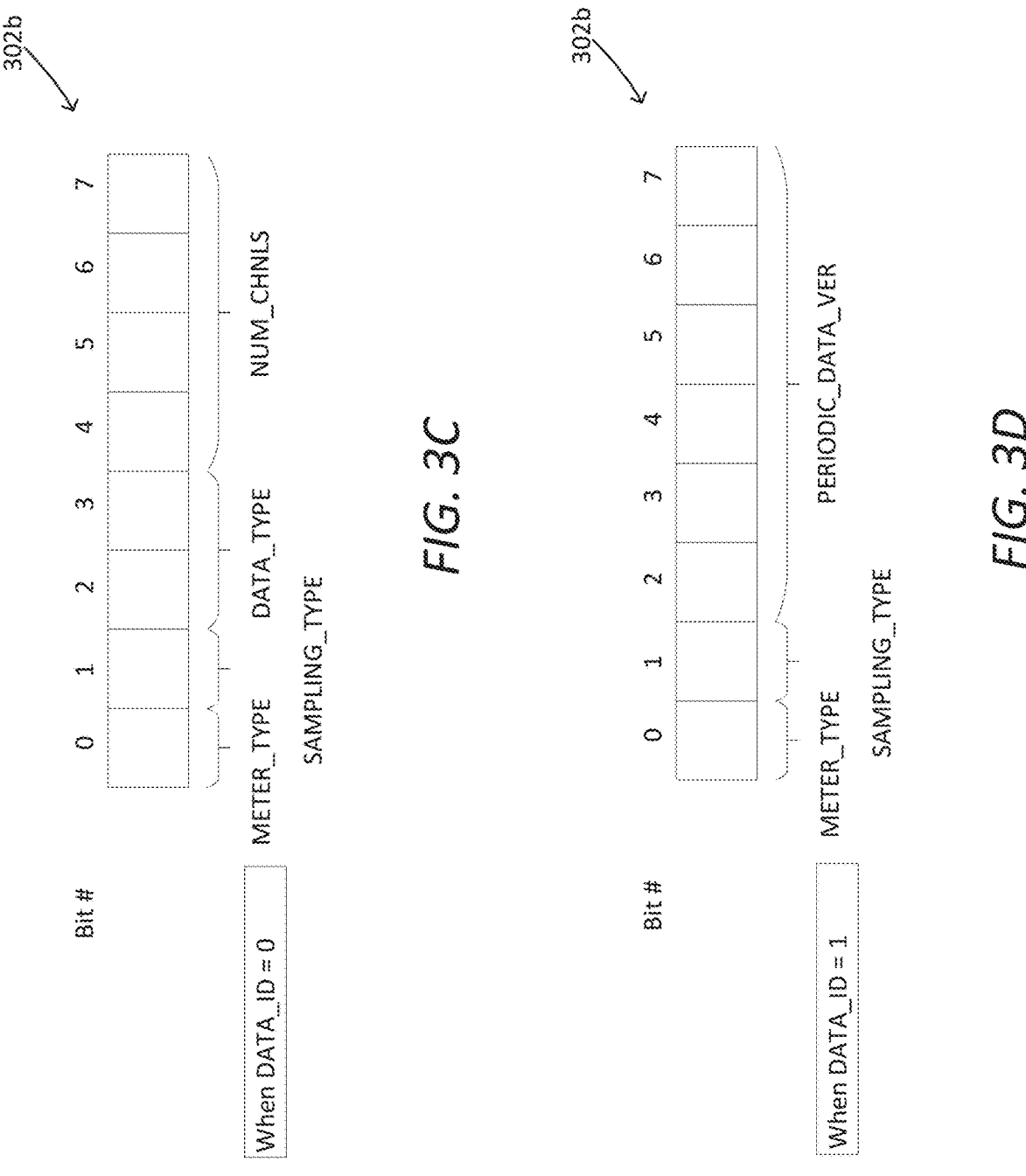
FIG. 3C is a diagram illustrating an example field 302*b* shown in FIG. 3A when the value of the subfield DATA_ID is 0, indicating continuous waveform data.
FIG. 3D is a diagram illustrating an example field 302*b* shown in FIG. 3A when the value of the subfield DATA_ID is 1, indicating processed data.

The field 302b is an INFO field with a size of eight bits, providing some additional static data about the type of meter and the version of the format of the data. FIG. 3C is a diagram illustrating an example field 302b when the value of the subfield DATA_ID is 0, indicating continuous waveform data. FIG. 3D is a diagram illustrating an example field 302b when the value of the subfield DATA_ID is 1, indicating processed data. In the example shown in FIG. 3C, the INFO field includes four subfields, namely the METER_TYPE subfield with a size of one bit, the SAMPLING_TYPE subfield with a size of one bit, the DATA_TYPE subfield with a size of two bits, and the NUM_CHNLS subfield with a size of four bits. When the value of the METER_TYPE subfield is 0, it indicates that the electronic energy meter 102 is a single-phase meter. When the value of the METER_TYPE subfield is 1, it indicates that the electronic energy meter 102 is a poly-phase (e.g., three-phase) meter. When the value of the SAMPLING_TYPE subfield is 1, it indicates fixed sampling per second. In other words, the number of samples per second is fixed. When the value of the SAMPLING_TYPE subfield is 0, it indicates fixed sampling per cycle. In other words, the number of samples per cycle of the AC is fixed. When the value of the DATA_TYPE subfield is 0, it indicates that the data type is 32-bit floating point waveform data. The values 1 to 3 are reserved for the future. The values of the NUM_CHNLS subfield range from 1 to 15, corresponding to 1 to 15 channels. For a three-phase meter, there may be six channels that correspond to phase A voltage, phase B voltage, phase C voltage, phase A current, phase B current, and phase C current.

In the example shown in FIG. 3D, METER_TYPE field includes three subfields, namely the METER_TYPE subfield with a size of one bit, the SAMPLING_TYPE subfield with a size of one bit, and the PERIODIC_DATA_VER subfield with a size of six bits. The METER_TYPE subfield and the SAMPLING_TYPE subfield are the same as those shown in FIG. 3C. The values of the PERIODIC_DATA_VER subfield range from 0 to 63, corresponding to sixty-four versions. As the periodic data may evolve over time or vary for different metering applications 108, different periodic data versions may be used. For example, a first version of the periodic data may include the line frequency and the apparent power, while a second version of the periodic data may include the line frequency, the apparent power, and the reactive power. Examples of periodic data are illustrated below with reference to Table 1.

The field 302c is a SAMPLE_RATE field with a size of sixteen bits. When the value of the DATA_ID subfield is 0, indicating waveform data, the sampling rate is in Hz or samples per cycle, based on the SAMPLING_TYPE subfield. When the value of the DATA_ID subfield is 1, indicating processed data, the sampling rate is the rate at which the processed data is updated at nominal line frequency in milliseconds.

Figure 3E:
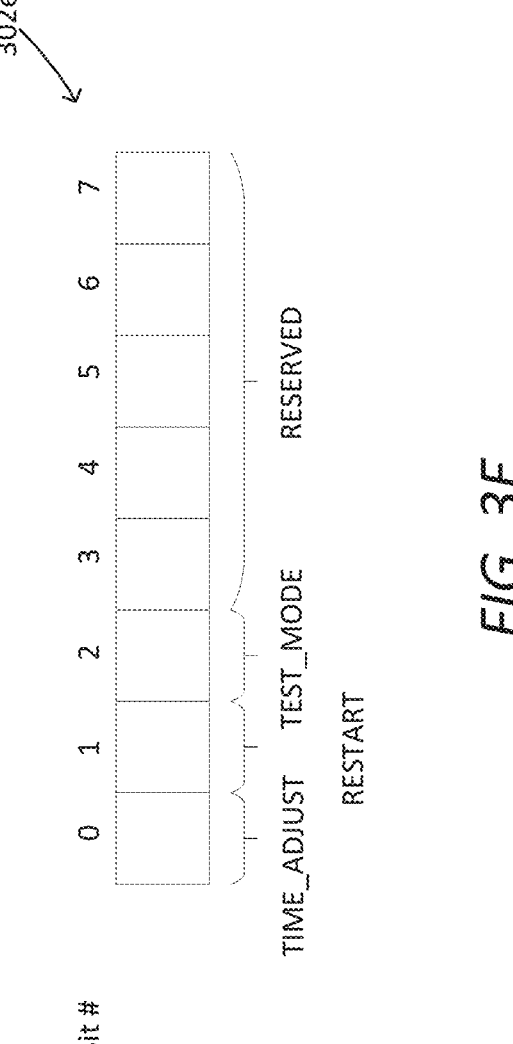
FIG. 3E is a diagram illustrating an example field 302*e* shown in FIG. 3A.

The field 302e is a STATUS field with a size of eight bits, indicating information on the data and its integrity. FIG. 3E is a diagram illustrating an example field 302e. In the example shown in FIG. 3E, the STATUS field includes four subfields, namely the TIME_ADJUST subfield with a size of one bit, the RESTART subfield with a size of one bit, the TEST_MODE subfield with a size of one bit, and the RESERVED subfield with a size of five bits. When the value of the TIME_ADJUST subfield is 1, it indicates that a clock adjustment has occurred that may impact the timestamps of this set of samples relative to adjacent updates. The data can be assumed to be accurate under these conditions. The RESTART subfield is set to 1 after a reboot or power-up of the electronic energy meter 102. The SEQUENCE_NUM-BER field 302g restarts from 0 after a reboot or power-up. When the value of the TEST_MODE subfield is 1, it indicates that the electronic energy meter 102 is in the test mode. The bits #3 to #7 are reserved for the future.

The field 302g is a SEQUENCE_NUMBER field with a size of 32 bits. When the value of the DATA_ID subfield is 0 (i.e., for the continuous stream of waveform data 132), each sample has a sequence number associated with it. The sequence number in this frame (i.e., packet) is associated with the first sample of the field 302j (i.e., the DATA field) in the frame. The DATA field will be described in detail below. When the value of the DATA_ID subfield is 1 (i.e., for the processed data 134), one periodic data set is sent in each frame, and therefore its sequence number will increase by one with each periodic data set being sent. For both scenarios, the value of the SEQUENCE_NUMBER field will roll over to 0 when it overflows.

The field 302h is a TIMESTAMP field with a size of 64 bits. Each sample has a timestamp associated with it. The timestamp in this frame is associated with the first sample in the frame. In one implementation, the value of the TIME-STAMP field is in μS since Jan. 1, 1970 GMT.

The field 302j is the DATA field with a dynamic size. When waveform data is included, this field includes the data. When processed data is included, this field includes data as shown in Table 1. The fields 302f and 302i are reserved for the future and may keep the header word-aligned. It should be understood that the data structure 300 and the fields 302 of the data structure described above are exemplary rather than limiting, and other data structures or fields can be employed as needed.

When the value of the DATA_ID subfield is 1 (i.e., for the processed data 134), the data groups, types, names, item sizes, item numbers, and total sizes of the periodic data are illustrated in Table 1 below.

TABLE 1

| DATA GROUP | TYPE | NAME | SIZE OF ITEMS | # OF ITEMS | TOTAL SIZE |
|---|---|---|---|---|---|
| Instantaneous | Float | Active Power per phase | 4 | 3 | 12 |
| Instantaneous | Float | Fundamental Power per phase | 4 | 3 | 12 |
| Instantaneous | Float | Reactive Power RMS per phase | 4 | 3 | 12 |
| Instantaneous | Float | Reactive Power Vector per phase | 4 | 3 | 12 |
| Instantaneous | Float | Apparent Power RMS per phase | 4 | 3 | 12 |
| Instantaneous | Float | Apparent Power Vector per phase | 4 | 3 | 12 |

TABLE 1-continued

| DATA GROUP | TYPE | NAME | SIZE OF ITEMS | # OF ITEMS | TOTAL SIZE |
|---|---|---|---|---|---|
| Instantaneous | Float | Active Energy per phase | 4 | 3 | 12 |
| Instantaneous | Float | Fundamental Active Energy per phase | 4 | 3 | 12 |
| Instantaneous | Float | Reactive Energy Rms per phase | 4 | 3 | 12 |
| Instantaneous | Float | Reactive Energy Vector per phase | 4 | 3 | 12 |
| Instantaneous | Float | Fundamental Reactive Energy per phase | 4 | 3 | 12 |
| Instantaneous | Float | Voltage per phase | 4 | 3 | 12 |
| Instantaneous | Float | Current per phase | 4 | 3 | 12 |
| Instantaneous | Float | Ground Voltage | 4 | 1 | 4 |
| Instantaneous | Float | Neutral Current | 4 | 1 | 4 |
| Instantaneous | Float | Calculated Neutral Current | 4 | 1 | 4 |
| Instantaneous | Float | Fundamental Voltage per phase | 4 | 3 | 12 |
| Instantaneous | Float | Fundamental Current per phase | 4 | 3 | 12 |
| Instantaneous | Unsigned 16 bit | Zero Crossings per phase | 2 | 3 | 6 |
| Instantaneous | Unsigned 16 bit | Sample count per phase | 2 | 3 | 6 |
| Instantaneous | Float | Voltage Angle per phase | 4 | 3 | 12 |
| | | | | | 12 |
| Instantaneous | Float | Voltage Angle Ground | 4 | 1 | 4 |
| Instantaneous | Float | Current Angle per phase | 4 | 3 | 12 |
| Instantaneous | Float | DC Current per phase | 4 | 3 | 12 |
| Instantaneous | Float | DC Neutral Current | 4 | 1 | 4 |
| Instantaneous | Float | DC Voltage per phase | 4 | 3 | 12 |
| Instantaneous | Float | DC Ground Voltage | 4 | 1 | 4 |
| Instantaneous | Float | Apparent Energy RMS per phase | 4 | 3 | 12 |
| Instantaneous | Float | Apparent Energy Vector per phase | 4 | 3 | 12 |
| Instantaneous | Float | Ixx [ePhaseN + 1] | 4 | 4 | 16 |
| Instantaneous | Float | Wxx [ePhaseN + 1] | 4 | 4 | 16 |
| Instantaneous | Float | Apparent Energy RMS Total | 4 | 1 | 4 |
| Instantaneous | Float | Apparent Energy Vector Total | 4 | 1 | 4 |
| Instantaneous | Float | Apparent Power RMS Total | 4 | 1 | 4 |
| Instantaneous | Float | Apparent Power Vector Total | 4 | 1 | 4 |
| Instantaneous | Float | Line Frequency | 4 | 1 | 4 |
| Instantaneous | Float | Integration Time | 4 | 1 | 4 |
| Instantaneous | Float | Load Side Phase A Voltage | 4 | 1 | 4 |
| Instantaneous | Float | Load Side Phase C Voltage | 4 | 1 | 4 |
| Instantaneous | Float | Load Side Phase A to C Voltage | 4 | 1 | 4 |
| Instantaneous | Unsigned 32 bit | Status | 4 | 1 | 4 |
| Instantaneous | Unsigned 64 bit | Time Stamp | 8 | 1 | 8 |
| Peak | Unsigned 64 bit | Time Stamp | 8 | 1 | 8 |
| Peak | Float | Peak Voltage per phase | 4 | 3 | 12 |
| Flicker | Unsigned 64 bit | Time Stamp | 1 | 8 | 8 |
| Flicker | Float | pInst per phase, per cycle each half cycle | 4 | 75 | 300 |

TABLE 1-continued

| DATA GROUP | TYPE | NAME | SIZE OF ITEMS | # OF ITEMS | TOTAL SIZE |
|---|---|---|---|---|---|
| RMS Power Quality | Unsigned 16 bit | IA_STAT (status information about interval aggregation (e.g. PLL locked)) | 1 | 2 | 2 |
| RMS Power Quality | Float | Upq[ePhaseTotal] (u1, u2, u3, uG) | 4 | 4 | 16 |
| RMS Power Quality | Float | Ipq[ePhaseTotal] (i1, i2, i3, iN) | 4 | 4 | 16 |
| RMS Power Quality | Float | FUpq[ePhaseN] (fundamentals of line-to-line voltages) | 4 | 3 | 12 |
| RMS Power Quality | Unsigned 64 bit | Timestamp | 1 | 8 | 8 |
| FFT | Unsigned 64 bit | Timestamp FFT Voltages | 1 | 8 | 8 |
| FFT | Float | Voltage | 4 | 196 | 784 |
| FFT | Unsigned 64 bit | Timestamp FFT Currents | 1 | 8 | 8 |
| FFT | Float | Current | 4 | 196 | 784 |
| RMS | Unsigned 64 bit | Timestamp Voltages | 1 | 8 | 8 |
| RMS | Float | Voltage per cycle per phase + ground | 4 | 106 | 424 |
| RMS | Unsigned 64 bit | Timestamp Currents | 1 | 8 | 8 |
| RMS | Float | Current per cycle per phase + neutral | 4 | 106 | 424 |
| Status | Unsigned 8 bit | Std03 | 1 | 16 | 16 |
| Status | Unsigned 8 bit | Button Status | 1 | 1 | 1 |
| Status | Unsigned 8 bit | Manual Test mode Count | 1 | 1 | 1 |
| Status | Unsigned 8 bit | Optical Test mode Count | 1 | 1 | 1 |
| Status | Unsigned 32 bit | Last Programming Time | 4 | 1 | 4 |
| Status | Unsigned 16 bit | Gyrbox Counters | 2 | 7 | 14 |
| Status | Float | Accelerometer Readings in radians | 4 | 3 | 12 |
| Status | Unsigned 32 bit | EIC Event Log Last Sequence Number | 4 | 1 | 4 |

FIG. 4A is a flowchart diagram illustrating a method 400 for operating an electricity metering system comprising an electronic energy meter and a metering application host. In the example shown in FIG. 4, the method 400 includes operations 402, 404, 406, 408, 410, 412, 414, and 416. Additional operations may be performed.

At operation 402, an electronic energy meter (e.g., the electronic energy meter 102 shown in FIG. 1) receives an analog poly-phase signal (e.g., the analog poly-phase signal 142 shown in FIG. 1) associated with power delivered using AC.

At operation 404, the electronic energy meter converts the analog poly-phase signal to a digital poly-phase signal (e.g., the digital poly-phase signal 144 shown in FIG. 1).

At operation 406, the electronic energy meter generates processed data (e.g., the processed data 134 shown in FIG. 1) and a continuous stream of waveform data (e.g., the continuous stream of waveform data 132 shown in FIG. 1).

At operation 408, a continuous waveform data stream module (e.g., the continuous waveform data stream module 112 shown in FIG. 1) of a metering application host (e.g., the metering application host 110 shown in FIG. 1) receives the continuous stream of waveform data.

At operation 410, a first metering application (e.g., the metering application 108a shown in FIG. 1) hosted by the metering application host requests at least a first portion of the continuous stream of waveform data.

At operation 412, the continuous waveform data stream module transfers the at least a first portion of the continuous stream of waveform data to the first metering application.

At operation 414, a second metering application (e.g., the metering application 108b shown in FIG. 1) hosted by the metering application host requests at least a second portion of the continuous stream of waveform data. The first portion of the continuous stream of waveform data is different from the second portion of the continuous stream of waveform data.

At operation 416, the continuous waveform data stream module then transfers the at least a second portion of the continuous stream of waveform data to the second metering application.

FIG. 4B is a flowchart diagram illustrating a method 400' for operating an electricity metering system comprising an electronic energy meter and a metering application host. In the example shown in FIG. 4B, the method 400' includes operations 452, 454, 456, 458, 460, 462, and 464. Additional operations may be performed.

At operation 452, an electronic energy meter (e.g., the electronic energy meter 102 shown in FIG. 1) receives an analog poly-phase signal (e.g., the analog poly-phase signal 142 shown in FIG. 1) associated with power delivered using AC.

At operation 454, the electronic energy meter converts the analog poly-phase signal to a digital poly-phase signal (e.g., the digital poly-phase signal 144 shown in FIG. 1).

At operation 456, the electronic energy meter generates processed data (e.g., the processed data 134 shown in FIG. 1) and a continuous stream of waveform data (e.g., the continuous stream of waveform data 132 shown in FIG. 1).

At operation 458, a continuous waveform data stream module (e.g., the continuous waveform data stream module 112 shown in FIG. 1) of a metering application host (e.g., the metering application host 110 shown in FIG. 1) receives the continuous stream of waveform data.

At operation 460, a first metering application (e.g., the metering application 108a shown in FIG. 1) hosted by the metering application host requests at least a portion of the continuous stream of waveform data.

At operation 462, the continuous waveform data stream module transfers the at least a portion of the continuous stream of waveform data to the first metering application.

At operation 464, the first metering application receives at least a portion of the processed data in response to a triggering event.

Example of a Computing System in Some Implementations

Figure 5:
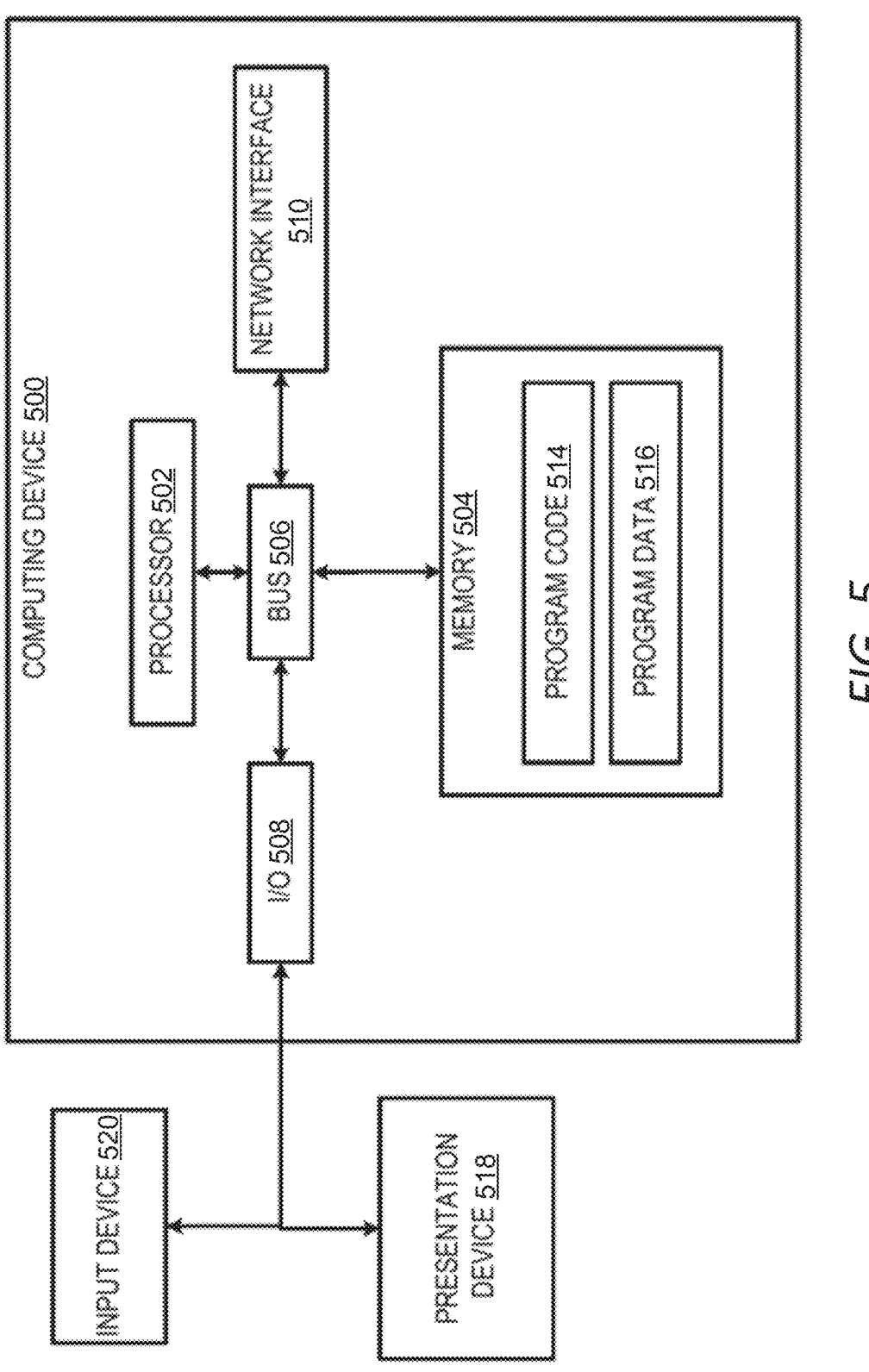
FIG. 5 is a diagram illustrating an example of the computing system.

Any suitable computing system or group of computing systems can be used for performing the operations described herein. For example, FIG. 5 is a diagram illustrating an example of the computing system 500.

The depicted example of a computing system 500 includes a processor 502 communicatively coupled to one or more memory devices 504. The processor 502 executes computer-executable program code stored in a memory device 504, accesses information stored in the memory device 504, or both. Examples of the processor 502 include a microprocessor, an application-specific integrated circuit ("ASIC"), a field-programmable gate array ("FPGA"), or any other suitable processing device. The processor 502 can include any number of processing devices, including a single processing device.

A memory device 504 includes any suitable non-transitory computer-readable medium for storing program code 514 (e.g., the code used for various operations of the electricity metering system 100 shown in FIG. 1), program data 516 (e.g., the data structure 300 shown in FIG. 3), or both. A computer-readable medium can include any electronic, optical, magnetic, or other storage devices capable of providing a processor with computer-readable instructions or other program code. Non-limiting examples of a computer-readable medium include a magnetic disk, a memory chip, a ROM, a RAM, an ASIC, optical storage, magnetic tape or other magnetic storage, or any other medium from which a processing device can read instructions. The instructions may include processor-specific instructions generated by a compiler or an interpreter from code written in any suitable computer-programming language, including, for example, C, C++, C#, Visual Basic, Java, Python, Perl, JavaScript, and ActionScript.

The computing system 500 executes program code 514 that configures the processor 502 to perform one or more of the operations described herein. The program code may be resident in the memory device 504 or any suitable computer-readable medium and may be executed by the processor 502 or any other suitable processor.

In some implementations, one or more memory devices 504 stores program data 516 that includes one or more datasets described herein. In some implementations, one or more of data sets, models, and functions are stored in the same memory device (e.g., one of the memory devices 504). In additional or alternative implementations, one or more of the programs, data sets, models, and functions described herein are stored in different memory devices 504 accessible via a data network. One or more buses 506 are also included in the computing system 500. The bus 506 communicatively couples one or more components of a respective one of the computing system 500.

In some implementations, the computing system 500 also includes a network interface device 510. The network interface device 510 includes any device or group of devices suitable for establishing a wired or wireless data connection to one or more data networks. Non-limiting examples of the network interface device 510 include an Ethernet network adapter, a modem, and/or the like. The computing system 500 is able to communicate with one or more other computing devices via a data network using the network interface device 510.

The computing system 500 may also include a number of external or internal devices, such as an input device 520, a presentation device 518, or other input or output devices. For example, the computing system 500 is shown with one or more input/output ("I/O") interfaces 508. An I/O interface 508 can receive input from input devices or provide output to output devices. An input device 520 can include any device or group of devices suitable for receiving visual, auditory, or other suitable input that controls or affects the operations of the processor 502. Non-limiting examples of the input device 520 include a touchscreen, a mouse, a keyboard, a microphone, a separate mobile computing device, etc. A presentation device 518 can include any device or group of devices suitable for providing visual, auditory, or other suitable sensory output. Non-limiting examples of the presentation device 518 include a touchscreen, a monitor, a speaker, a separate mobile computing device, etc.

Although FIG. 5 depicts the input device 520 and the presentation device 518 as being local to the computing device, other implementations are possible. For instance, in some implementations, one or more of the input device 520 and the presentation device 518 can include a remote client-computing device that communicates with the computing system 500 via the network interface device 510 using one or more data networks.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as an open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method for operating an electricity metering system comprising an electronic energy meter and a metering application host, the method comprising:
   receiving, by the electronic energy meter, an analog signal associated with power delivered using alternating current (AC);
   converting, by the electronic energy meter, the analog signal to a digital signal;

generating, by the electronic energy meter, processed data and a continuous stream of waveform data;
receiving, by a continuous waveform data stream module of the metering application host, the continuous stream of waveform data;
requesting, by a first metering application hosted by the metering application host, at least a first portion of the continuous stream of waveform data;
transferring, by the continuous waveform data stream module, the at least a first portion of the continuous stream of waveform data to the first metering application;
requesting, by a second metering application hosted by the metering application host, at least a second portion of the continuous stream of waveform data, wherein the first portion of the continuous stream of waveform data is different from the second portion of the continuous stream of waveform data; and
transferring, by the continuous waveform data stream module, the at least a second portion of the continuous stream of waveform data to the second metering application.

2. The method of claim 1, wherein the continuous stream of waveform data is in a time domain.

3. The method of claim 1, wherein the continuous stream of waveform data is in a frequency domain.

4. The method of claim 1, further comprising:
   deriving, by the first metering application, intermediate measurements from the at least a first portion of the continuous stream of waveform data.

5. The method of claim 1, further comprising:
   receiving, by the first metering application, at least a portion of the processed data.

6. The method of claim 1, wherein the processed data comprises one or more of voltage measurements, current measurements, and energy measurements.

7. The method of claim 1, further comprising:
   detecting a fundamental frequency of the analog signal based on the digital signal; and
   resampling the digital signal at a resampling rate, wherein the resampling rate is based on and tracks the fundamental frequency.

8. The method of claim 1, further comprising:
   sending, by the first metering application, a customization request to the electronic energy meter to customize the processed data for the first metering application.

9. An electricity metering system comprising:
   an electronic energy meter comprising:
      an analog-to-digital converter (ADC) configured to convert an analog signal associated with power delivered using alternating current (AC) to a digital signal; and
      a power signal processing unit configured to generate processed data and a continuous stream of waveform data;
   a metering application host interfacing with the electronic energy meter, the metering application host comprising:
      a continuous waveform data stream module configured to receive the continuous stream of waveform data;
      a first metering application configured to receive at least a first portion of the continuous stream of waveform data from the continuous waveform data stream module; and
      a second metering application configured to receive at least a second portion of the continuous stream of waveform data from the continuous waveform data stream module, wherein the first portion of the continuous stream of waveform data is different from the second portion of the continuous stream of waveform data.

10. The electricity metering system of claim 9, wherein the continuous stream of waveform data is in a time domain.

11. The electricity metering system of claim 9, wherein the continuous stream of waveform data is in a frequency domain.

12. The electricity metering system of claim 9, wherein the first metering application is further configured to derive intermediate measurements from the at least a first portion of the continuous stream of waveform data.

13. The electricity metering system of claim 9, wherein the first metering application is further configured to receive at least a portion of the processed data.

14. The electricity metering system of claim 9, wherein the processed data comprises one or more of voltage measurements, current measurements, and energy measurements.

15. The electricity metering system of claim 9, wherein the power signal processing unit is further configured to:

detect a fundamental frequency of the analog signal based on the digital signal; and resample the digital signal at a resampling rate, wherein the resampling rate is based on and tracks the fundamental frequency.

16. The electricity metering system of claim 9, wherein the metering application host is a Universal Serial Bus (USB) host.

* * * * *